United States Patent [19]

Fujimura et al.

[11] Patent Number: 4,535,234
[45] Date of Patent: Aug. 13, 1985

[54] LIGHT EXPOSURE APPARATUS WITH COOLING MEANS

[75] Inventors: Takashi Fujimura; Katsuyu Takahashi; Masahiro Nishizawa, all of Mobara, Japan

[73] Assignee: Hitachi, Ltd., Tokyo, Japan

[21] Appl. No.: 306,606

[22] Filed: Sep. 29, 1981

[30] Foreign Application Priority Data

Oct. 1, 1980 [JP] Japan ............................... 55-135862

[51] Int. Cl.$^3$ .............................................. H01J 7/24
[52] U.S. Cl. .................................................. 250/238
[58] Field of Search ....................... 250/238, 574, 554; 313/13, 35

[56] References Cited

U.S. PATENT DOCUMENTS 3,603,827  9/1971  Degawa et al. .................. 313/35 X Primary Examiner—David C. Nelms
Attorney, Agent, or Firm—Charles E. Pfund

[57] ABSTRACT

Light exposure apparatus comprises a light source, a spectral filter perivious to light of a prescribed wavelength range, a glass member whose cut-off frequency in the prescribed wavelength range is variable with temperature, and a temperature control for controlling the temperature of the glass member. Intensity of the light from the light source, passing through the spectral filter and glass member, and impinging upon the surface subject to light-exposure is controlled by the temperature control.

5 Claims, 14 Drawing Figures

LIGHT EXPOSURE APPARATUS WITH COOLING MEANS

BACKGROUND OF THE INVENTION

This invention relates to light exposure apparatus suitable for use in light exposure for the pattern formation in the manufacture of color picture tubes and semiconductor integrated circuits.

In the formation of a pattern of phosphors of varying colors on the inner surface of a face panel in a color picture tube, for example, rays of light are radiated from the light source so as to advance in the same paths as would be followed by electron beams and then impinge upon a photosensitive film covering the inner surface and consequently light-expose the points of impingement. In this case, the amount of light exposure is proportional to the intensity of light impinging upon the photosensitive film, and this operation of light exposure has entailed the problem that, for a certain length of time after the light source has been turned on, the intensity of light is varied to impair the uniformity of the amount of light exposure and that of pattern formation.

A search for the cause of this phenomenon has revealed that some of the filters and lenses used in the optical system of the light exposure apparatus suffer variation of their cut-off frequencies on the short wavelength side as the temperature varies and that when these filters and lenses gradually gain in temperature with elapse of time after the light source has been turned on, the intensity of the light impinging upon the surface exposed to the light is varied proportionally to the rise of the temperature.

SUMMARY OF THE INVENTION

This invention contemplates to solve the problem described above. An object of this invention is to provide light exposure apparatus capable of providing constant intensity of light which impinges upon the surface subjected to light-exposure.

To accomplish this object, according to the present invention, in light exposure apparatus in which light of a prescribed wavelength range emitted from a light source and passed through a spectral filter is caused, while in route to the surface being exposed, to pass through a glass member the cut-off frequency of which in the prescribed wavelength range is varied with temperature, the intensity of the light impinging upon the surface being maintained at a constant level by the regulation of the temperature of the glass member with temperature control means.

DESCRIPTION OF PREFERRED EMBODIMENT

Figure 1:
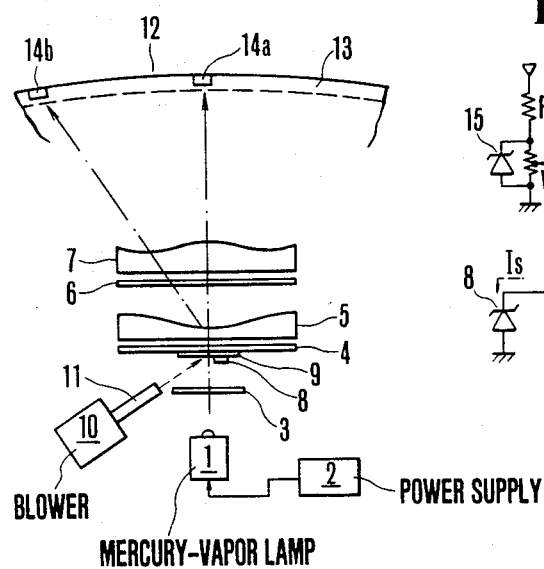
FIG. 1 is a schematic diagram of one preferred embodiment of a light exposure apparatus according to the present invention as applied to the manufacture of color picture tubes.

FIG. 1 shows an example of a light exposure apparatus according to the present invention as applied to the manufacture of color picture tubes. Although not illustrated, the invention may also be applied to light exposure apparatus used for pattern formation of semiconductor integrated circuits.

In FIG. 1 a mercury-vapor lamp 1 serves as a light source, 2 a power source for supplying electric power to the mercury-vapor lamp, 3 a spectral filter possessing a hill-shaped transmittivity characteristic in a range of wavelength of from 300 to 400 nm, 4 a grading filter of 1.3 mm thick soda-lime glass serving as a first lens, 5 a second lens of plain plate glass BK-7, 6 a correction filter serving as a third lens, 7 a correction lens serving as a fourth lens, 8 a temperature sensor of Zener diode attached, as separated by a distance of about 10 mm from the optical axis, to a glass substrate 9 mounted on the grading filter 4, 10 a blower serving to blow off high-pressure air, 11 a hose for directing the high-pressure air onto the glass substrate 9, 12 a face panel of a color picture tube, 13 a shadow mask, 14a an incident light sensor disposed at the center of the face panel 12 and serving to measure the intensity of light, and 14b an incident light sensor disposed at a peripheral position of the face panel 12. During the measurement of the intensity of light, the incident light sensors 14a, 14b are set in position on the inner surface of the face panel 12. Prior to the actual light exposure, the sensors 14a and 14b are removed and a photosensitive film is formed on the inner surface of the face panel 12.

Figure 2:
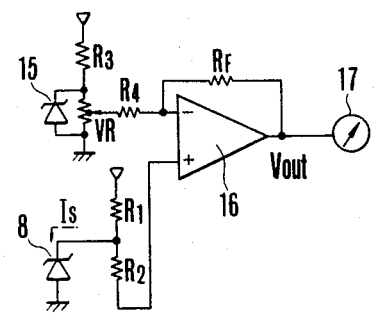
FIG. 2 is a diagram showing a circuit for temperature measurement.

FIG. 2 shows a circuit for temperature measurement. In the figure, 15 denotes a temperature sensor amplifier, 17 an indicator, $R_F$ a feedback resistor, $R_1$ through $R_4$ each an input resistor, and VR a variable resistor. Let $I_s$ stand for the magnitude of electric current flowing to the temperature sensor 8, $T_1$ and $T_2$ respectively for the temperatures detected by the temperature sensors 8, 15, and K for a constant and assume $R_1 = R_3 = 4.3$ K then $R_2 = R_4$, and the output voltage of the operational amplifier 16 will be expressed by the following formula:

$$V_{\text{out}} = \frac{-R_1}{4.3}\left[\frac{KT_1}{e}\ln\left(1 + \frac{-1}{I_s \cdot f(T_1)}\right) - \frac{KT_2}{e}\ln\left(1 + \frac{1}{I_s \cdot f(T_2)}\right)\right]$$

Thus, the temperature of the glass substrate or the grading filter 4 can be read out of the indicator.

In this arrangement, after the mercury-vapor lamp 1 is turned on, the temperature of the grading filter 4 rises and the light transmittivity proportionally decreases with the elapse of time. When the hose 11 blows off the high-pressure air onto the glass substrate 9, the rise of the temperature is repressed to keep the light transmittivity at a constant level. Consequently, the intensity of light on the inner surface of the face panel 12 is kept constant.

Now, the results of various measurements made with the present embodiment of the light exposure apparatus will be described with reference to graphs.

Figure 3:
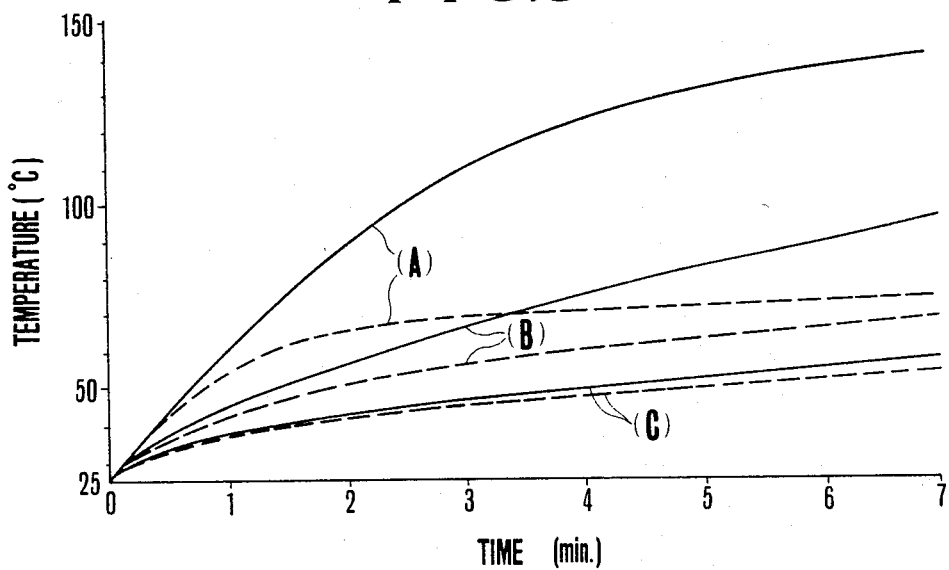
FIG. 3 is a graph showing temperature rise characteristics of various lenses.

FIG. 3 shows temperature elevation properties of various lenses in the optical system. During the measurements, the room temperature was fixed at 25° C. and the power of the mercury-vapor lamp at 1 KW. The distances from the light source were 57.6 mm to the glass substrate 9, 59.0 mm to the first lens, and 79.6 mm to the correction filter 6, respectively. The correction filter 6 was also made of soda-lime glass. In the figure, solid curves represent the properties exhibited normally without forced cooling and the dotted-line curves represent the properties exhibited when the blower 10 was operated to feed the high-pressure air supplied under a pressure of 0.5 kg/cm² to the glass substrate 9. Curve (A) represents the property obtained of the grading filter 4 through the detection by temperature sensor 8, curve (B) that obtained of the first lens 5, and curve (C) that of the correction filter 6, respectively. Temperatures of first lens 5 and correction filter 6 were detected by suitable sensors not shown. The cooling of the grading filter 4 to a temperature which is above dew point has an effect of preventing the other lenses from gaining in temperature, although this effect dwindles with the increasing distance. It is noted from the figure that repression of temperature rise in the various lenses started two to three minutes after the lamp had been turned on.

Figure 4:
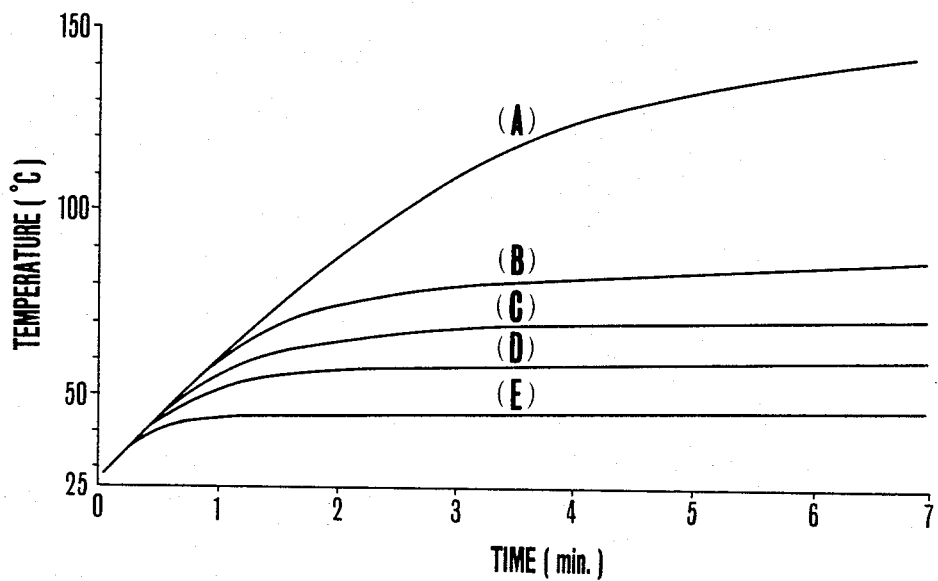
FIG. 4 is a graph showing temperature rise characteristics exhibited by the grading filter when the cooling conditions are changed.

FIG. 4 shows the temperature elevation properties exhibited by the grading filter 4 when the cooling conditions were changed by varying pressure of the high-pressure air. Curve (A) represents the property exhibited in the absence of cooling, and curves (B), (C), (D), and (E) represent the properties exhibited under the pressures of 0.2 kg/cm², 0.5 kg/cm², 1.0 kg/cm², and 2.0 kg/cm² respectively. Compared with the property of (A) involving no cooling, the properties of (B) and (C) involving relatively small extents of cooling reflect the effect of cooling to fair extents.

Figure 5:
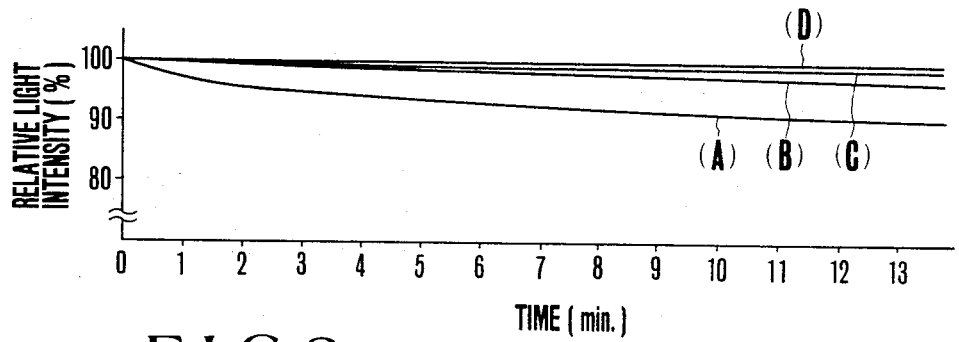
FIG. 5 is a graph showing relative light intensity characteristics exhibited at the central position when the cooling conditions are similarly changed.

FIG. 5 shows the relative light intensity properties exhibited at the central position of the inner surface of the face panel when the cooling conditions were changed by varying the pressure of the high-pressure air. The change is expressed by the ratio of the intensity of light detected by the incident light sensor 14a at the central position to the initial intensity of light taken as 100. Curve (A) represents the property exhibited in the absence of cooling and curves (B), (C), and (D) represent the properties exhibited under the pressures of 0.2 kg/cm², 1.0 kg/cm², and 2.0 kg/cm² respectively. On elapse of more than 10 minutes after the lamp had been turned on, the curve (A) showed a fall of 9 percent and the curves (B), (C), and (D) showed small falls of 3 percents, 1 percent, and 0.8 percents respectively.

Figure 6:
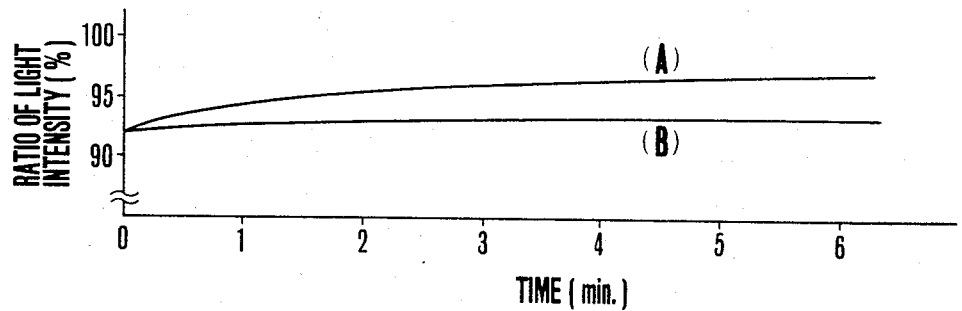
FIG. 6 is a graph showing the change in the ratio of the intensity of light detected at the central position to that detected at the peripheral position.

FIG. 6 shows the change in the ratio of the intensity of light detected at the central position to the intensity of light detected at the peripheral position by the incident light sensor 14b. Curve (A) represents the property exhibited in the absence of cooling and curve (B) the property exhibited when the pressure was 1.0 kg/cm². It is noted from the figure that, on elapse of 6 minutes after the lamp had been turned on, the ratio increased by 5 percent in (A) and by only 1 percent in (B).

In the embodiment so far described, the grading filter 4 was made of a soda-lime glass of 1.3 mm in thickness. It can be made of any of various other materials. Now, the dependency on temperature of the change of the relative transmittivity of various glass materials will be described.

Figure 7:
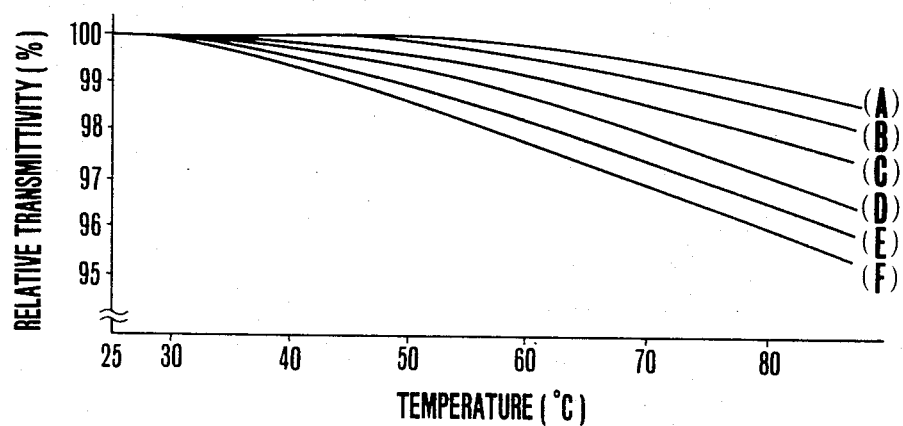
FIG. 7 is a graph showing the relative transmittivity characteristics of various glass materials.

FIG. 7 shows relative transmittivity properties indicating the change of transmittivity of various glass materials due to the change of temperature, with abscissa representing temperature of glass materials and ordinate representing relative transmittivity under the room temperature (25° C.) condition taken as 100. Each of the glasses involved was used in the form of a grading filter 4 and cooled with the high-pressure air of 1.0 kg/cm². Curve (A) represents the property of a BK-7 glass of 2.5 mm in thickness, the curve (B) that of a filter formed by vapor depositing 35 percent Ni on a 2.5 mm thick BK-7 glass, curve (C) that of the same soda-lime glass of 1.3 mm thickness as used in the embodiment described above, curve (D) that of a lens glass, curve (E) that of a soda-lime glass of 3.0 mm thickness, and curve (F) that of a filter formed by vapor depositing 35 percent Ni on a 1.3 mm thick soda-lime glass. It is noted from the figure that the relative transmittivity is variable with the material and thickness of glass and with the presence or absence of vapor-deposited coating. It is seen particularly that the BK-7 glass showed less change of spectral transmittivity due to the change of temperature, indicating that the spectral filter using this glass offers stabler light intensity than that using soda-lime glass.

Figure 8:
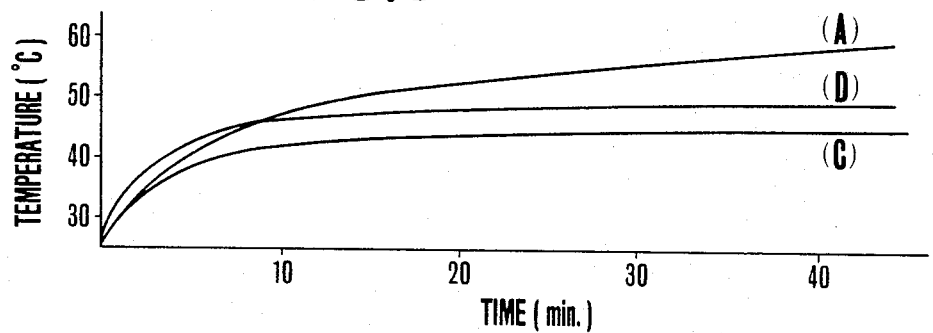
FIG. 8 is a graph comparing soda-lime glass and BK-7 glass in terms of temperature elevation property.

FIG. 8 compares soda-lime glass and BK-7 glass in terms of temperature rise. The test conditions involved in this case were the same as those of FIG. 7. Curve (A) represents the property exhibited by a filter formed by vapor depositing 35 percent Ni on a soda-lime glass, curve (B) the property exhibited by a BS-7 glass sheet of 2.5 mm thickness, and curve (C) the property exhibited by a filter formed by vapor depositing 35 percent Ni on a BK-7 glass.

Figure 9:
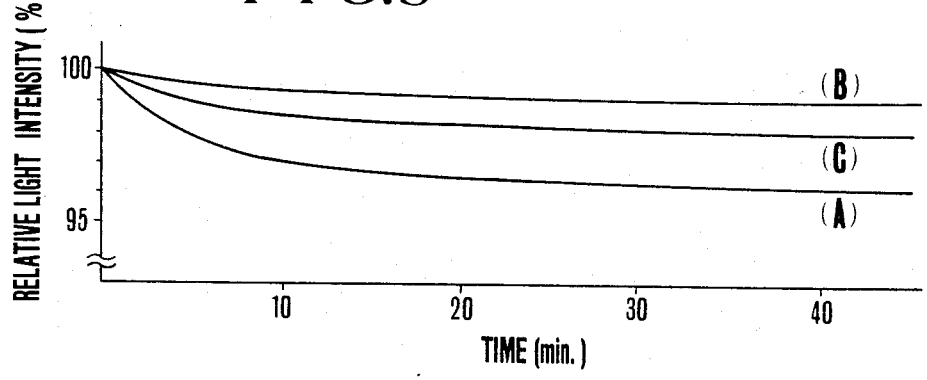
FIG. 9 is a graph showing a similar comparison in terms of relative light intensity.

FIG. 9 shows a similar comparison in terms of relative light intensity at the central position. It is noted that on elapse of 6 minutes, the relative light intensity fell by 3 percents in the case of soda-lime glass of (A), whereas it fell by only 1 percent in the case of BK-7 glass of (B). Curve (C) corresponds to the property exhibited by a BK-7 glass with a 35% Ni vapor deposited coating.

Figure 10:
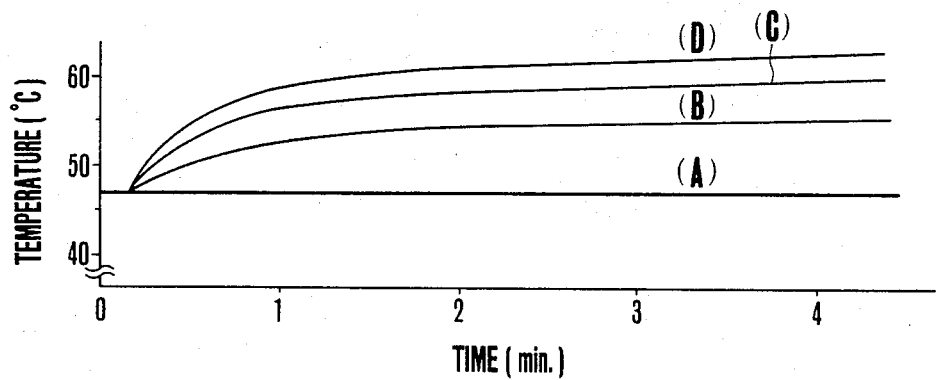
FIG. 10 is a graph showing the change in the temperature elevation property observed when electric power of the mercury-vapor lamp is varied.
Figure 11:
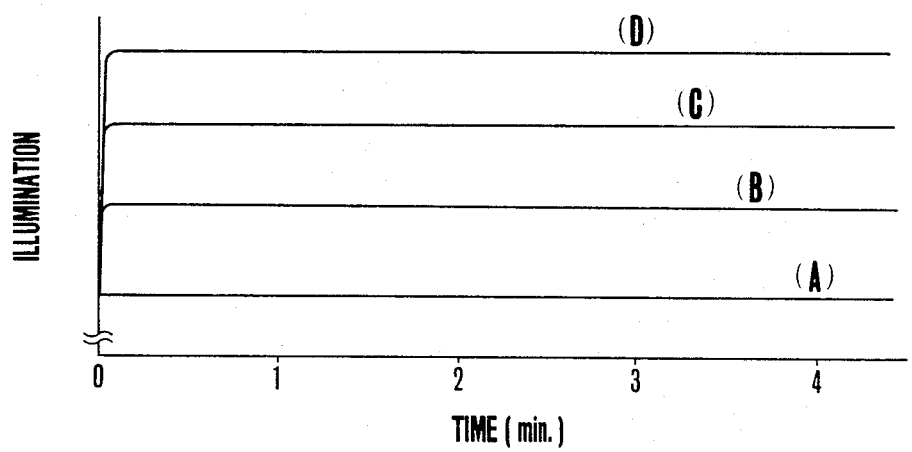
FIG. 11 is a graph showing the change in the light intensity property observed when electric power of the mercury-vapor lamp is similarly varied.

FIG. 10 shows the rise of temperature of a grading filter 4 (soda-lime glass) observed when the electric power of the mercury-vapor lamp was varied and FIG. 11 shows the change of light intensity (value of illumination) at the central position of the inner surface of the face panel observed when the electric power of the mercury-vapor lamp was similarly varied. The cooling was effected with the pressure of air fixed at 0.5 kg/cm$^2$. In each of the two diagrams, curve (A) represents the property exhibited when the electric power of the mercury vapor lamp was 500 W and curves (B), (C), and (D) represent the properties exhibited when electric power was abruptly raised from 500 W to 700 W, from 500 W to 900 W, and from 500 W to 1100 W respectively. It is noted that at all the levels of electric power involved, the light intensity in terms of illumination at the central position was kept substantially at a fixed value despite the sharp rise in electric power.

Figure 12:
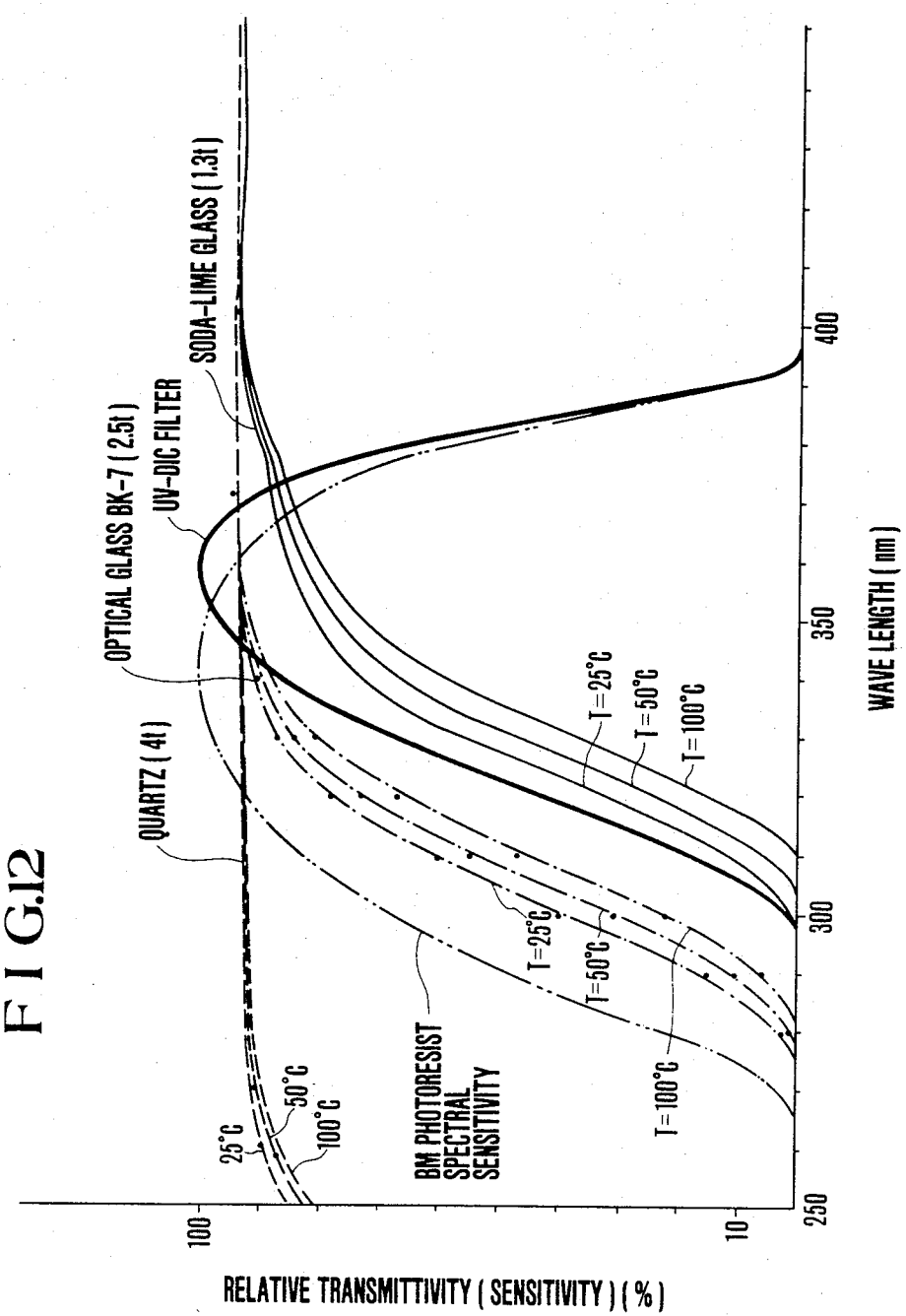
FIG. 12 is a graph showing the relation between wavelength and relative transmittivity for various glass materials.

FIG. 12 shows wavelength characteristics in accordance with types of glass materials used for lenses and filters in the optical system of the light exposure apparatus. When using a spectral filter 3 of a UV-DIC filter manufactured by Toshiba, a wavelength range of from 300 to 400 nm covering spectral sensitivity of photoresist for black matrix type color picture tubes can be obtained. However, the soda-line glass and BK-7 glass have within the above wavelength range temperature characteristics as shown in FIG. 12 wherein wavelength curves shift toward longer wavelengths as the temperature increases and toward shorter wavelengths as the temperature decreases. Such a shifting of the wavelength curves is found reversible. On the other hand, quartz glass has no temperature dependency within a wavelength range of from 250 to 400 nm and is stable. But difficulties are encountered in making a quartz glass correction lens of complicated curved surfaces and a quartz glass optical lens. In addition, quartz glass is expensive even in the form of a flat plate. Accordingly, it is desirable to use soda-line glass and BK-7 glass. In employment of the soda-line and BK-7 glass materials in the optical system, the temperature needs to be always kept constant in order to obtain the constant transmittivity and especially, kept at lower values for the sake of obtaining higher transmittivities.

Figure 13:
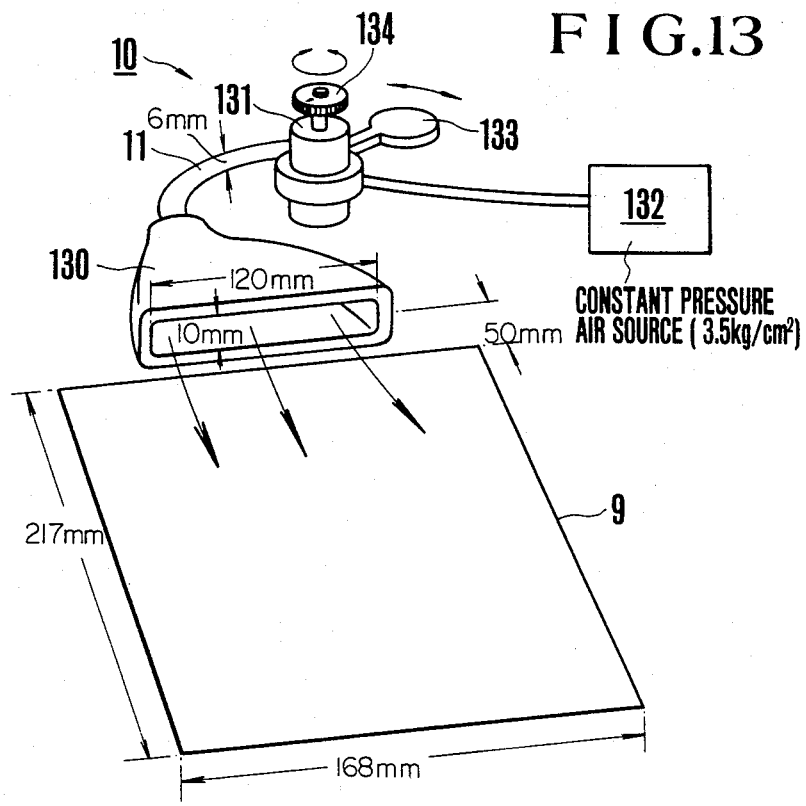
FIG. 13 is a perspective view of a blower according to the invention.

A blower 10 as exemplified in FIG. 13 has an outlet port member 130 mounted to one end of the hose 11. The outlet port member is disposed near the glass substrate 9 and has an elongated opening suitable for blow-off onto one surface of the glass substrate 9. Connected to the other end of the hose is a regulator valve 131 through which air from a constant pressure air source 132 is fed to the outlet port member. The valve (3) is provided with a pressure adjusting lever 133. Accordingly, by manipulating the lever 133, the blow-off pressure can be adjusted. Denoted by 134 is a cock for opening and closing the valve 131. The blower 10 has dimensions as indicated in FIG. 13.

Although in experiments, there was observed no correction between the temperature detected and the pressure of the cooling air, it is possible to control the pressure of the cooling air so as to maintain the temperature at a fixed level by feeding the temperature signal of the grading filter back to the air blower. By this feedback arrangement, it becomes possible to regulate the light intensity on the surface exposed to light constantly at the prescribed value.

Figure 14:
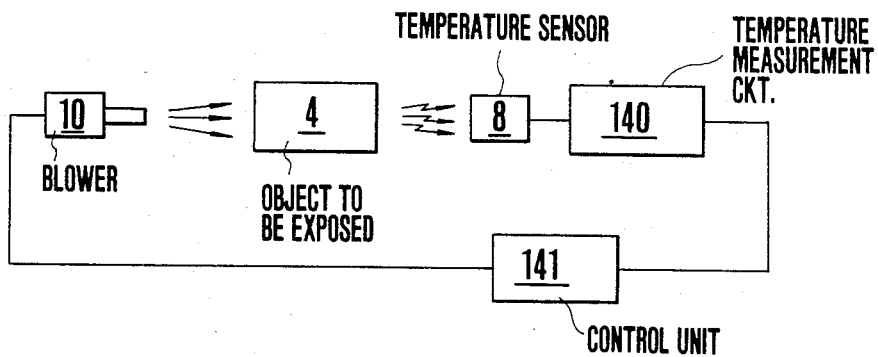
FIG. 14 is a schematic block diagram showing a closed loop for control of the blower according to the invention.

FIG. 14 shows an example of such a closed loop controlling wherein a control unit 141 is interposed between the output of a temperature measurement circuit 140 as shown in FIG. 2 and the blower 10. The control unit 141 is actuated in response to output signals of the circuit 140 and the adjusting lever 133 of the blower is adjusted in accordance with the actuation of the control unit.

According to the light exposure apparatus contemplated by this invention, since the spectral transmittivity of the glass such as of the grading filter can be regulated to a constant value by controlling the temperature of the glass as described above, this invention brings about an effect of stabilizing the light intensity on the surface exposed to light a very short time after the light source has been turned on.

What is claimed is:

1. In a light exposure system having a lamp house containing a lamp simultaneously emitting ultraviolet rays and heat rays, the improvement comprising a plurality of spaced glass optical elements for transmitting light from said lamp and lamp house, said glass optical elements each having an optical characteristic which varies with temperature, and means for controlling cooling pressure flow of a gas on the light incident side of said optical element nearest said lamp house in order to cool said optical elements thereby to minimize influence of said heat rays upon the ultraviolet rays passed by said optical elements.

2. A light exposure apparatus according to claim 1 wherein said cooling means comprises a blower disposed near an optical element to be cooled, and including a temperature measurement circuit having a temperature sensor mounted to the optical element being cooled.

3. A light exposure apparatus according to claim 2 wherein the blower has a regulator valve, a control unit is interposed between said blower and the output of the temperature measurement circuit, and the control unit is actuated in response to output signals of the measurement circuit to control the regulator valve of said blower.

4. A light exposure apparatus according to claim 1 wherein incident light sensors are mounted to said object to be exposed to light.

5. A light exposure apparatus according to claim 4 wherein an incident light sensor is provided at the central position of said object and an incident light sensor is provided at the peripheral position of said object.

* * * * *

UNITED STATES PATENT AND TRADEMARK OFFICE
CERTIFICATE OF CORRECTION

PATENT NO. : 4,535,234

DATED : August 13, 1985

INVENTOR(S) : Fujimura et al.

It is certified that error appears in the above-identified patent and that said Letters Patent is hereby corrected as shown below:

Col. 2, l. 66: change "then" to --and--

Col. 2, l. 67: change "and" to --then--

Col. 4, l. 8: change both occurrences of "percents" to --percent--

Col. 5, l. 22: change "soda-line" to --soda-lime--

Col. 5, l. 35: change "soda-line" to --soda-lime--

Col. 5, l. 36: change "soda-line" to --soda-lime--

Signed and Sealed this

Fifteenth Day of April 1986

[SEAL]

Attest:

DONALD J. QUIGG

Attesting Officer

Commissioner of Patents and Trademarks